United States Patent
Gorman et al.

(10) Patent No.: US 8,853,847 B2
(45) Date of Patent: Oct. 7, 2014

(54) STACKED CHIP MODULE WITH INTEGRATED CIRCUIT CHIPS HAVING INTEGRATABLE AND RECONFIGURABLE BUILT-IN SELF-MAINTENANCE BLOCKS

(71) Applicant: International Business Machines Corporation, Armonk, NY (US)

(72) Inventors: Kevin W. Gorman, Fairfax, VT (US); Krishnendu Mondal, Bangalore (IN); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 13/656,836

(22) Filed: Oct. 22, 2012

(65) Prior Publication Data

US 2014/0110710 A1    Apr. 24, 2014

(51) Int. Cl.
*G01R 31/02* (2006.01)
*H01L 21/66* (2006.01)

(52) U.S. Cl.
CPC ..................................... *H01L 22/34* (2013.01)
USPC ....................... 257/686; 257/E21.529; 438/18

(58) Field of Classification Search
CPC ........ H01L 24/34; H01L 24/43; H01L 24/437
USPC ....................... 257/46, 686, E21.521; 438/18
See application file for complete search history.

(56) References Cited

U.S. PATENT DOCUMENTS

| | | | |
|---|---|---|---|
| 5,946,545 A | 8/1999 | Bertin et al. | |
| 5,968,192 A | 10/1999 | Kornachuk et al. | |
| 6,560,740 B1 | 5/2003 | Zuraski et al. | |
| 7,184,915 B2 | 2/2007 | Hansquine et al. | |
| 7,216,278 B2 | 5/2007 | Andreev et al. | |
| 7,304,355 B2 | 12/2007 | Zhang | |
| 7,379,316 B2 | 5/2008 | Rajan | |
| 7,599,205 B2 | 10/2009 | Rajan | |
| 7,631,236 B2 | 12/2009 | Gorman et al. | |

(Continued)

FOREIGN PATENT DOCUMENTS

| | | |
|---|---|---|
| JP | 2004-0253046 | 9/2004 |
| JP | 2010-027658 | 2/2010 |
| KR | 1020050028934 A | 3/2005 |
| WO | 0 173 459 A2 | 10/2001 |

OTHER PUBLICATIONS

U.S. Appl. No. 13/656,844.*

(Continued)

*Primary Examiner* — John C Ingham
(74) *Attorney, Agent, or Firm* — Gibb & Riley, LLC (57) ABSTRACT

Disclosed is a stacked chip module incorporating a stack of integrated circuit (IC) chips having integratable and automatically reconfigurable built-in self-maintenance blocks (i.e., built-in self-test (BIST) circuits or built-in self-repair (BISR) circuits). Integration of the built-in self-maintenance blocks between the IC chips in the stack allows for servicing (e.g., self-testing or self-repairing) of functional blocks at the module-level. Automatic reconfiguration of the built-in self-maintenance blocks further allows for functional blocks on any of the IC chips in the stack to be serviced at the module-level even when one or more controllers associated with a given built-in self-maintenance block on a given IC chip has been determined to be defective (e.g., during previous wafer-level servicing). Also disclosed is a method of manufacturing and servicing such a stacked chip module.

25 Claims, 7 Drawing Sheets

(56) References Cited

U.S. PATENT DOCUMENTS

| | | | |
|---|---|---|---|
| 7,702,975 | B2 | 4/2010 | Gorman et al. |
| 7,735,031 | B2 | 6/2010 | Chickanosky et al. |
| 7,763,911 | B2 | 7/2010 | Zhang |
| 7,797,594 | B1 | 9/2010 | Parulkar et al. |
| 7,895,028 | B2 | 2/2011 | Anand et al. |
| 8,040,745 | B2 | 10/2011 | Shibata |
| 8,060,774 | B2 | 11/2011 | Smith et al. |
| 8,080,442 | B2 | 12/2011 | Leedy |
| 8,124,429 | B2 | 2/2012 | Norman |
| 2006/0156134 | A1 | 7/2006 | Mukherjee et al. |
| 2006/0179377 | A1 | 8/2006 | Dawson et al. |
| 2007/0001708 | A1 | 1/2007 | Bertin et al. |
| 2007/0096759 | A1 | 5/2007 | Weinraub |
| 2008/0068039 | A1 | 3/2008 | Bernstein et al. |
| 2008/0215944 | A1 | 9/2008 | Averbuj et al. |
| 2010/0332177 | A1 | 12/2010 | Wu et al. |

OTHER PUBLICATIONS

RD 439133 A, "A Method for Scan Based Memory Test to Supplement Built-in Self-Test has ABIST Controller to Load and Execute a Unique Pattern to All Arrays in Parallel," Derwent-Acc-No. 2002-120410, Nov. 10, 2000, 1 page.

IPCOM000168299D, "Method of Utilizing Thermal Diodes for Power Generation and Cooling in Stacked Multi-Chip Modules," Mar. 5, 2008, 3 pages.

U.S. Appl. No. 13/656,844, Office Action Communication dated Apr. 1, 2014, 8 pages.

U.S. Appl. No. 131656,844. BUR920120094US1, Notice of Allowance dated Jun. 24, 2014, 3 pp.

Appendix P, "List of IBM Patents or Patent Applications Treated as Related", Jun. 30, 2014, 1 p.

* cited by examiner

STACKED CHIP MODULE WITH INTEGRATED CIRCUIT CHIPS HAVING INTEGRATABLE AND RECONFIGURABLE BUILT-IN SELF-MAINTENANCE BLOCKS

BACKGROUND

1. Field of the Invention

The disclosed embodiments relate to stacked chip modules and, more particularly, to a stacked chip module with integrated circuit (IC) chips having integratable and reconfigurable built-in self-maintenance blocks (i.e., built-in self-test (BIST) blocks or built-in self-repair (BISR) blocks).

2. Description of the Related Art

When individual integrated circuit (IC) chips are mounted side-by-side on a printed circuit board (PCB), they take up a significant amount of surface area. Additionally, signals are typically passed from IC chip to IC chip on the PCB through large high-power, high-speed links. Recently developed stacked chip modules (also referred to herein as stacked chip packages, three-dimensional (3D) chip stacks or 3D multi-chip modules) allow for reductions in form factor, interface latency and power consumption as well as an increase in bandwidth. These benefits stem from the fact that, within a stacked chip module, signals are passed through the IC chips using simple wire-based interconnects (e.g., through substrate vias (TSVs) and micro-controlled collapsed chip connections (C4-connections)). Thus, there is a reduction in wire delay, which results in corresponding reductions in interface latency and power consumption as well as an increase in bandwidth. Unfortunately, self-maintenance (i.e., self-servicing, such as self-testing and/or self-repairing) of the individual IC chips on a stacked chip module presents a number of special challenges and such self-maintenance is can be critical to ensure product reliability.

SUMMARY

In view of the foregoing, disclosed herein are embodiments of a stacked chip module incorporating a stack of integrated circuit (IC) chips having integratable and automatically reconfigurable built-in self-maintenance blocks (i.e., built-in self-test (BIST) blocks or built-in self-repair (BISR) blocks). Integration of the built-in self-maintenance blocks between the IC chips in the stack allows for servicing (e.g., self-testing or self-repairing) of functional blocks (e.g., memory arrays) at the stacked chip module-level. Automatic reconfiguration of the built-in self-maintenance blocks further allows for functional blocks on any of the IC chips in the stack to be serviced at the stack chip module-level even when one or more controllers associated with a given built-in self-maintenance block on a given IC chip have been determined to be defective (e.g., during previous wafer-level servicing). Also disclosed herein are embodiments of a method of manufacturing and servicing such a stacked chip module.

More particularly, disclosed herein are embodiments of a stacked chip module. In one embodiment, the stacked chip module can comprise a stack of integrated circuit (IC) chips. Each of the IC chips in the stack can comprise a functional block (e.g., a memory array), a self-maintenance block (e.g., a built-in self-test (BIST) block or a built-in self-repair (BISR) block), and a plurality of interconnect structures. The self-maintenance block can comprise built-in self-maintenance circuitry for servicing (e.g., self-testing or self-repairing, as applicable) the functional block during wafer-level servicing and stacked chip module-level servicing, a controller for the built-in self-maintenance circuitry and reconfiguration circuitry in communication with the controller. On each IC chip, the interconnect structures can be electrically connected to the reconfiguration circuitry and can further electrically connect the reconfiguration circuitry to any adjacent reconfiguration circuitry of any adjacent IC chips in the stack.

As a result, during stacked chip module-level servicing, the reconfiguration circuitry on any given IC chip can automatically and selectively enable either the controller on that given IC chip or another controller on another IC chip in the stack to operate in conjunction with the built-in self-maintenance circuitry. For example, the reconfiguration circuitry can automatically and selectively enable the controller on the same IC chip as the reconfiguration circuitry if that controller was previously determined to be functional. However, the reconfiguration circuitry can also automatically and selectively enable another controller on another one of the IC chips in the stack and, particularly, another controller on a lower IC chip in the stack or a higher IC chip in the stack chip if the controller on the same IC chip as the reconfiguration circuitry was previously determined to be defective.

In another embodiment, the stacked chip module can similarly comprise a stack of integrated circuit chips. In this case, each of the integrated circuit chips in the stack can comprise a functional block (e.g., a memory array), a self-maintenance block (e.g., a built-in self-test (BIST) block or a built-in self-repair (BISR) block), a plurality of first interconnect structures and a plurality of second interconnect structures. The self-maintenance block can comprise built-in self-maintenance circuitry for servicing (e.g., self-testing or self-repairing, as applicable) the functional block during wafer-level servicing and module-level servicing, a first controller and a second controller for the built-in self-maintenance circuitry, first reconfiguration circuitry in communication with the first controller and the built-in self-maintenance circuitry, and second reconfiguration circuitry in communication with the first controller and the second controller. The first interconnect structures can be electrically connected to the first reconfiguration circuitry and can further electrically connect the first reconfiguration circuitry to any adjacent first reconfiguration circuitry of any adjacent IC chips in the stack. Similarly, the second interconnect structures can be electrically connected to the second reconfiguration circuitry and can further electrically connect the second reconfiguration circuitry to any adjacent second reconfiguration circuitry of any adjacent integrated circuit chips in the stack As a result, during stacked chip module-level servicing, the first reconfiguration circuitry on any given IC chip can automatically and selectively enable either the first controller on that given IC chip or another first controller on another IC chip in the stack to control servicing of the functional block by the built-in self-maintenance circuitry. For example, the first reconfiguration circuitry can automatically and selectively enable the first controller on the same IC chip as the first reconfiguration circuitry if that first controller was previously determined to be functional. However, the first reconfiguration circuitry can also automatically and selectively enable another first controller on another one of the IC chips in the stack and, particularly, another first controller on a lower IC chip in the stack or a higher IC chip in the stack chip if the first controller on the same IC chip as the first reconfiguration circuitry was previously determined to be defective.

Similarly, during stacked chip module-level servicing, the second reconfiguration circuitry on any given IC chip can automatically and selectively enable either the second controller on that given IC chip or another second controller on another IC chip in the stack to provide signal buffering to the first controller. For example, the second reconfiguration circuitry can automatically and selectively enable the second controller on the same IC chip as the second reconfiguration circuitry if that second controller was previously determined to be functional. However, the second reconfiguration circuitry can also automatically and selectively enable another second controller on another one of the IC chips in the stack and, particularly, another second controller on a lower IC chip in the stack or a higher IC chip in the stack chip if the second controller on the same IC chip as the second reconfiguration circuitry was previously determined to be defective.

Disclosed herein are also embodiments of stacked chip module manufacturing and servicing method. In one embodiment, the method can comprise manufacturing integrated circuit (IC) chips to be incorporated into a stacked chip module such that each IC chip comprises a functional block (e.g., a memory array), a built-in self-maintenance block (e.g., a built-in self-test (BIST) block or a built-in self-repair (BISR) block), and a plurality of interconnect structures. The built-in self-maintenance block can comprise built-in self-maintenance circuitry for servicing (e.g., self-testing or self-repairing, as applicable) of the functional block, a controller for the built-in self-maintenance circuitry, and reconfiguration circuitry in communication with the controller. The plurality of interconnect structures can be electrically connected to the reconfiguration circuitry.

Once the IC chips are manufactured, wafer-level servicing of the functional block of each IC chip can be performed using the built-in self-maintenance circuitry and the controller operating in conjunction with the built-in self-maintenance circuitry. During wafer-level servicing a determination can also be made regarding the condition of the controller (e.g., as either functional or defective).

After wafer-level servicing is performed, the IC chips can be packaged into a stacked chip module. Specifically, the IC chips can be arranged in a stack and, on each IC chip in the stack, the plurality of interconnect structures can be used to integrate (i.e., electrically connect) the reconfiguration circuitry of the built-in self-maintenance block to any adjacent reconfiguration circuitry of any adjacent built-in self-maintenance blocks on any adjacent IC chips in the stack.

Next, stacked chip module-level servicing of the functional blocks on the IC chips in the stack can be performed and, during this stacked chip module-level servicing, the reconfiguration circuitry on each IC chip in the stack can be used to spare around (i.e., multiplex around, work around, etc.) any defective controllers. Specifically, the stacked chip module-level servicing can comprise, on any given IC chip, automatically and selectively enabling, by the reconfiguration circuitry, either the controller on that given IC chip or another controller on another IC chip in the stack to operate in conjunction with the built-in self-maintenance circuitry. For example, the reconfiguration circuitry can automatically and selectively enable the controller on the same IC chip as the reconfiguration circuitry if that controller was previously determined to be functional; whereas the reconfiguration circuitry can automatically and selectively enable another controller on another one of the IC chips in the stack and, particularly, another controller on a lower IC chip in the stack or a higher IC chip in the stack chip if the controller on the same IC chip as the reconfiguration circuitry was previously determined to be defective.

In another embodiment, the method can similarly comprise manufacturing integrated circuit (IC) chips to be incorporated into a stacked chip module. However, in this case, each IC chip can be manufactured such that it comprises a functional block (e.g., a memory array), a self-maintenance block (e.g., a built-in self-test (BIST) block or a built-in self-repair (BISR) block)), a plurality of first interconnect structures and a plurality of second interconnect structures. The built-in self-maintenance block can comprise built-in self-maintenance circuitry for servicing (e.g., self-testing or self-repairing) the functional block at both the wafer-level and the stacked chip module-level, a first controller to control servicing of the functional block by the built-in self-maintenance circuitry at least during wafer-level servicing, first reconfiguration circuitry in communication with the first controller and the built-in self-maintenance circuitry, a second controller to provide signal buffering to the first controller at least during wafer-level servicing, and second reconfiguration circuitry in communication with the first controller and the second controller. The plurality of first interconnect structures can be electrically connected to the first reconfiguration circuitry and the plurality of second interconnect structures can be electrically connected to the second reconfiguration circuitry.

Once the IC chips are manufactured, wafer-level servicing of the functional block of each IC chip can be performed using the first controller to control servicing of the functional block by the built-in self-maintenance circuitry and using the second controller to provide signal buffering to the first controller. During wafer-level servicing determinations can also be made regarding the condition of the first controller (e.g., as either functional or defective) as well as the condition of the second controller (e.g., as either functional or defective).

Then, after the wafer-level servicing is performed, the IC chips can be packaged into a stacked chip module. Specifically, the IC chips can be arranged in a stack and, on each IC chip, the first and second interconnect structures can be used to integrate the first and second reconfiguration circuitry with the first and second reconfiguration circuitry, respectively, on any adjacent IC chips in the stack. That is, the plurality of first interconnect structures can be used to electrically connect the first reconfiguration circuitry, which is in communication with the first controller and the built-in self-maintenance circuitry, to any adjacent first reconfiguration circuitry of any adjacent IC chips in the stack. Similarly, the plurality of second interconnect structures can be used to electrically connect the second reconfiguration circuitry, which is in communication with the second controller and the first controller, to any adjacent second reconfiguration circuitry of any adjacent IC chips in the stack.

Next, stacked chip module-level servicing of the functional blocks on the IC chips in the stack can be performed and, during this stacked chip module-level servicing, the first and second reconfiguration circuitry on each IC chip in the stack can be used to spare around (i.e., multiplex around, work around, etc.) any defective first and/or second controllers. Specifically, stacked chip module-level servicing can comprise automatically and selectively enabling, by the first reconfiguration circuitry, either the first controller on that given IC chip or another first controller on another IC chip in the stack to control servicing of the functional block by the built-in self-maintenance circuitry. For example, the first reconfiguration circuitry can automatically and selectively enable the first controller on the same IC chip as the first reconfiguration circuitry if that first controller was previously determined to be functional; whereas the first reconfiguration circuitry can automatically and selectively enable another first controller on another one of the IC chips in the stack and, particularly, another first controller on a lower IC chip in the stack or a higher IC chip in the stack chip if the first controller on the same IC chip as the first reconfiguration circuitry was previously determined to be defective. Stacked chip module-level servicing can further comprise automatically and selectively enabling, by the second reconfiguration circuitry, either the second controller on that given IC chip or another second controller on another IC chip in the stack to provide signal buffering to the first controller. For example, the second reconfiguration circuitry can automatically and selectively enable the second controller on the same IC chip as the second reconfiguration circuitry if that second controller was previously determined to be functional; whereas the second reconfiguration circuitry can be used to automatically and selectively enable another second controller on another one of the IC chips in the stack and, particularly, another second controller on a lower IC chip in the stack or a higher IC chip in the stack chip if the second controller on the same IC chip as the second reconfiguration circuitry was previously determined to be defective.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, individual integrated circuit (IC) chips are mounted side-by-side on a printed circuit board (PCB), they take up a significant amount of surface area. Additionally, signals are typically passed from IC chip to IC chip on the PCB through large high-power, high-speed links. Recently developed stacked chip modules (also referred to herein as stacked chip packages, three-dimensional (3D) chip stacks or 3D multi-chip modules) allow for reductions in form factor, interface latency and power consumption as well as an increase in bandwidth. These benefits stem from the fact that, within a stacked chip module, signals are passed through the IC chips using simple wire-based interconnects (e.g., through substrate vias (TSVs) and micro-controlled collapsed chip connections (C4-connections)). Thus, there is a reduction in wire delay, which results in corresponding reductions in interface latency and power consumption as well as an increase in bandwidth. Unfortunately, self-maintenance (i.e., self-servicing, such as self-testing and/or self-repairing) of the individual IC chips on a stacked chip module presents a number of special challenges and such self-maintenance can be critical to ensure product reliability.

For example, IC chips and, particularly, IC chips that incorporate a functional block, such as a memory array, often also incorporate one or more built-in self-maintenance blocks (i.e., a built-in self-test (BIST) block and, optionally, a built-in self-repair (BISR) block). The BIST block is used to efficiently test the elements of the functional block (e.g., the memory elements of the memory array) and determine if repairs are necessary. The BISR block is used to determine which repairs are necessary and can also be used to dictate how those repairs are to be recorded (e.g., in fuses) such that after testing is completed, the repairs can also be completed. The BIST and BISR blocks are specifically designed for use at the wafer-level (i.e., on a two-dimensional (2D) structure). However, such built-in self-maintenance blocks typically become ineffectual when multiple IC chips are subsequently packaged into a stacked chip module (i.e., into a 3D chip stack) because they are not integrated between the IC chips and, thereby do not allow for stacked chip module-level self-testing and/or self-repair which can be critical to ensure product reliability.

In view of the foregoing, disclosed herein are embodiments of a stacked chip module incorporating a plurality of integrated circuit (IC) chips having integratable and automatically reconfigurable built-in self-maintenance blocks (i.e., built-in self-test (BIST) blocks or built-in self-repair (BISR) blocks). Integration of the built-in self-maintenance blocks between the IC chips in the stack allows for servicing (e.g., self-testing or self-repairing) of functional blocks (e.g., memory arrays) at the stacked chip module-level. Automatic reconfiguration of the built-in self-maintenance blocks further allows for functional blocks on any of the IC chips in the stack to be serviced at the stack chip module-level even when one or more controllers associated with a given built-in self-maintenance block on a given IC chip have been determined to be defective (e.g., during previous wafer-level servicing). Also disclosed herein are embodiments of a method of manufacturing and servicing such a stacked chip module.

Figure 1:
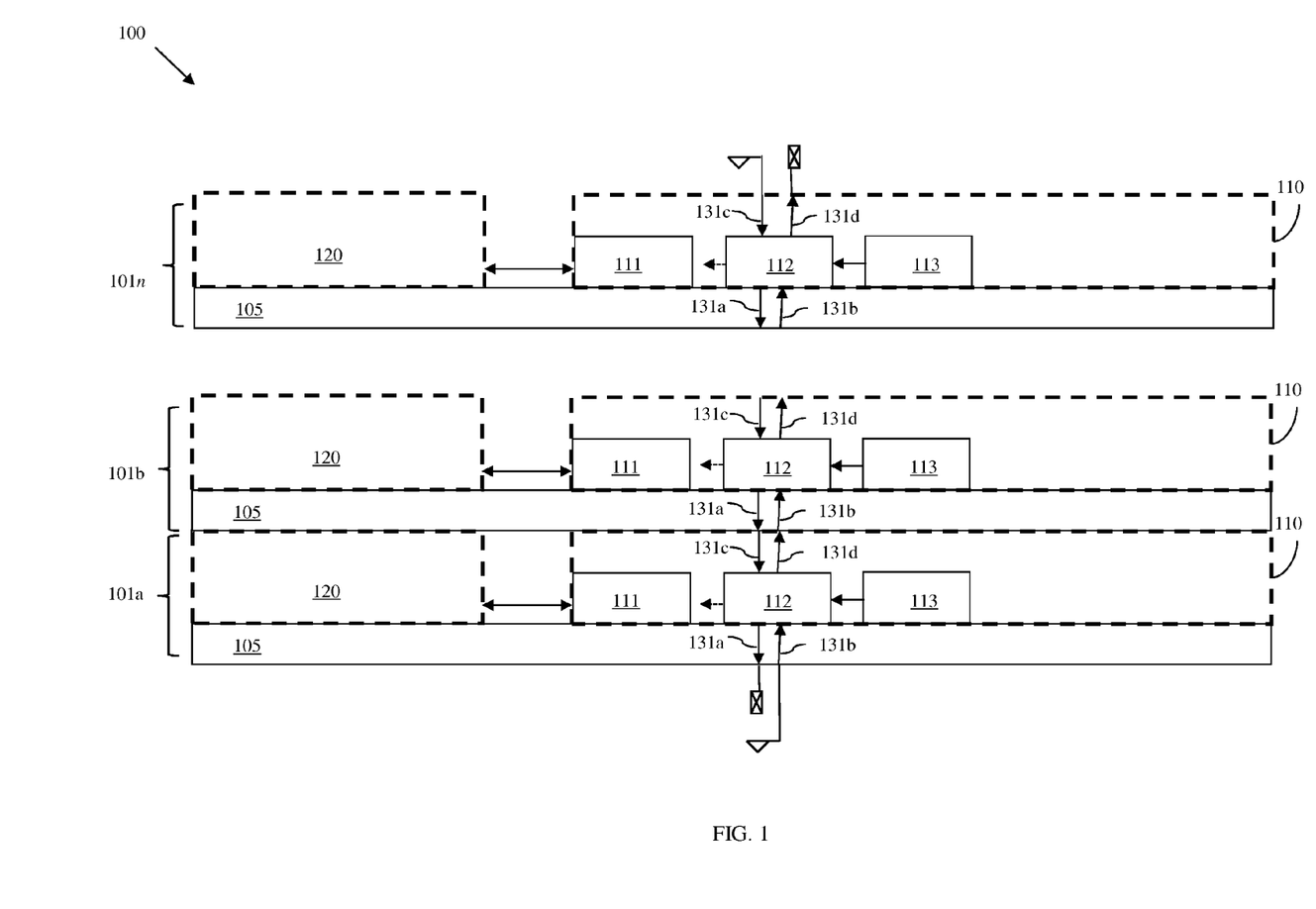
FIG. 1 is a schematic diagram illustrating an embodiment of a stacked chip module.

Referring to FIG. 1, disclosed herein are embodiments of a stacked chip module 100. The stacked chip module 100 can comprise a stack of integrated circuit (IC) chips 101a-101n. For purposes of illustration, the stacked chip module 100 is shown as having three stacked IC chips. However, it should be understood that the stacked chip module 100 can, alternatively, comprise any number of two or more IC chips. Each of the IC chips 101a-101n in the stack can comprise a substrate 105, a functional block 120 and a built-in self-maintenance block 110 on the substrate, and a plurality of interconnect structures 131a-d.

The functional block 120 on each IC chip 101a-101n can comprise a memory array. For example, the functional block can comprise a dynamic random access memory (DRAM) array, a static random access memory (SRAM) array, or any other suitable memory array. Alternatively, the functional block can comprise another other type of digital or analog circuit capable of being subject to self-maintenance (i.e., self-servicing, such as self-testing or self-repairing).

The built-in self-maintenance block 110 on each IC chip 101a-101n can be, for example, a built-in self-test (BIST) block for testing the functional block 120 or a built-in self-repair (BISR) block for repairing the functional block 120. Thus, this built-in self-maintenance block 110 can comprise built-in self-maintenance circuitry 111 (e.g., built-in self-testing circuitry or built-in self-repairing circuitry, as applicable) for servicing the functional block 120 at both the wafer-level and the stacked chip module-level. The built-in self-maintenance block 110 can further comprise at least one controller 113 (e.g., an embedded processor) that is associated with the built-in self-maintenance circuitry 111. For example, this controller 113 can control (i.e., be adapted to control, configured to control, programmed to control, etc.)

the built-in self-maintenance circuitry 111 during servicing. Alternatively, this controller 113 can provide (i.e., can be adapted to provide, can be configured to provide, etc.) signal buffering and, if necessary, an interface with an off-chip tester (not shown) during serving. Alternatively, this controller 113 can provide (i.e., can be adapted to provide, can be configured to provide, can be programmed to provide) any other function to be performed in conjunction with the built-in self-maintenance circuitry 111 during servicing. Finally, the built-in self-maintenance block 110 can further comprise reconfiguration circuitry 112 that provides a communication link between the controller 113 and the built-in self-maintenance circuitry 111 in order to selectively enable or disable operation of the controller 113 in conjunction with the built-in self-maintenance circuitry 111.

The plurality of interconnect structures 131a-d can be electrically connected to the reconfiguration circuitry 112 and can further electrically connect the reconfiguration circuitry 112 to any adjacent reconfiguration circuitry 112 of any adjacent IC chips in the stack. Specifically, the interconnect structures 131a-d can comprise, for example, a combination of through substrate vias (TSVs) 131a-b allowing electrical connections between the reconfiguration circuitry 112 and any adjacent reconfiguration circuitry 112 on any IC chip immediately below and wires and/or vias 131c-d within the IC chip wiring levels allowing electrical connections between the reconfiguration circuitry 112 and any adjacent reconfiguration circuitry 112 on any IC chip immediately above. In this case, the wires/vias 131c-d on the bottom IC chip 101a in the stack can be electrically and physically connected to the TSVs 131a-b, respectively, of the next higher IC chip 101b in the stack and, thereby to the reconfiguration circuitry 112 of the built-in self-maintenance block 110 on the IC chip 101b. Similarly, the wires/vias 131c-d on the IC chip 101b can be electrically and physically connected to the TSVs 131a-b, respectively, of the next higher IC chip 101n in the stack and, thereby to the reconfiguration circuitry 112 of the built-in self-maintenance block 110 on that IC chip 101n. As a result, these interconnect structures 131a-d integrate the built-in self-maintenance blocks 110 and, particularly, the reconfiguration circuitry 112 of those built-in self-maintenance blocks 110 across all of the IC chips 101a-101n in the stack.

Figure 2:
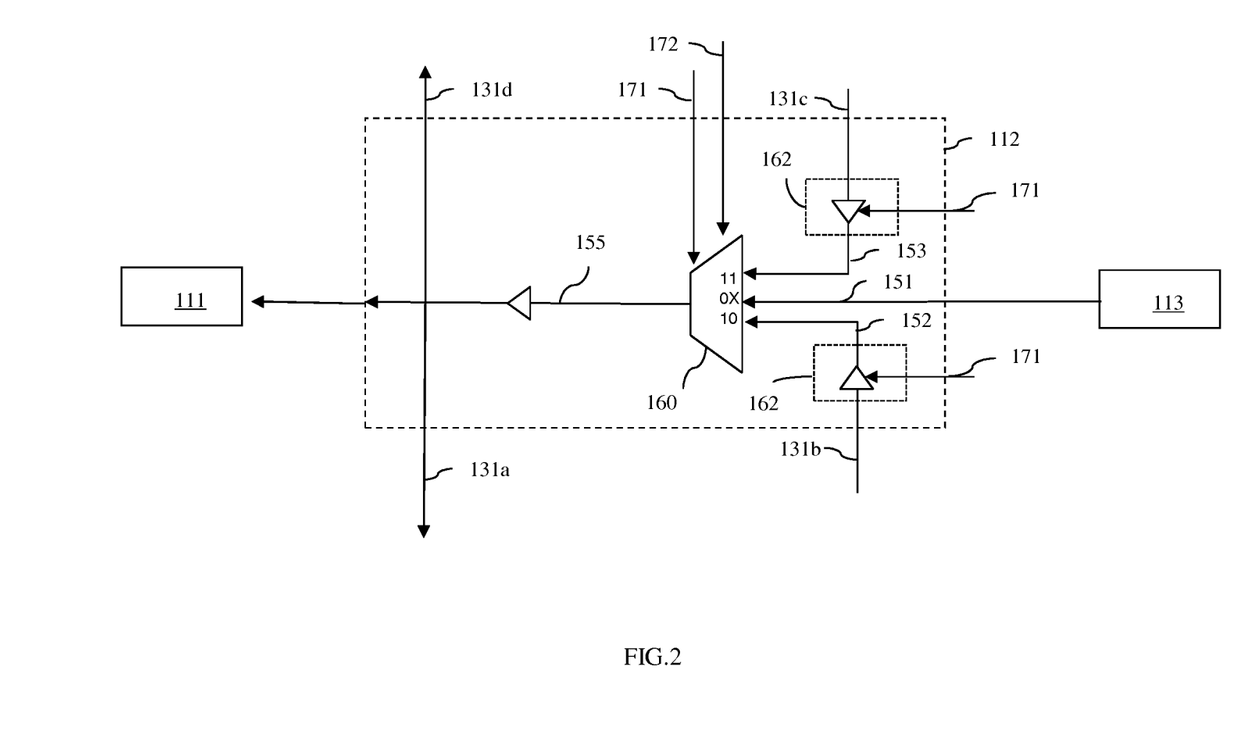
FIG. 2 is a schematic diagram illustrating exemplary reconfiguration circuitry that can be incorporated into the stacked chip module of FIG. 1.

Referring to FIG. 2, the reconfiguration circuitry 112 of each built-in self-maintenance block 110 can comprise, for example, a multiplexer 160 or any other suitable multi-signal switching mechanism. This multiplexer 160 can receive three input signals: (1) an input signal 151 from the controller 113 on the same IC chip; (2) an input signal 152 from reconfiguration circuitry 112 on an IC chip immediately below, if any (e.g., through TSV 131b) and (3) an input signal 153 from reconfiguration circuitry 112 on an IC chip immediately above, if any (e.g., through wire/via 131c). The multiplexer 160 can further receive control signals 171 and 172 that determine which of the three input signals 151, 152 and 153 to automatically and selectively output as an output signal 155 for operation in conjunction with the on-chip self-maintenance circuitry 111. As illustrated, this output signal 155 can further be transmitted down to any reconfiguration circuitry 112 immediately below (e.g., through TSV 131a) and up to any reconfiguration circuitry 112 immediately above (e.g., through wire/via 131d). As a result, the multiplexer 160 can automatically and selectively enable either the controller 113 on the same chip or another controller 113 on another IC chip (e.g., above or below) in the stack to operate in conjunction with the built-in self-maintenance circuitry during stacked chip module-level servicing by transmitting the appropriate input signal 151, 152 or 153.

For purposes of illustration, operation of an exemplary multiplexer 160 on any given IC chip during stacked chip module-level servicing is described in detail below with respect to IC chip 101b. During stacked chip module-level servicing, the multiplexer 160 can receive and be controlled by (i.e., can be adapted to receive and be controlled by, can be configured to receive and be controlled by) a controller condition signal 171 and a down/up select signal 172. The controller condition signal 171 can indicate the condition of the controller 113 on IC chip 101b, as either functional or defective. The multiplexer 160 can automatically and selectively enable the controller 113 on IC chip 101b to operate in conjunction with the built-in self-maintenance circuitry 111 on IC chip 101b, when the controller condition signal 171 indicates that the controller 113 on IC chip 101b is functional, by transmitting the input signal 151 as the output signal 155. The multiplexer 160 can also automatically and selectively enable another controller 113 from another IC chip in the stack to operate in conjunction with the built-in self-maintenance circuitry 111, when the controller condition signal 171 indicates that the controller 113 on IC chip 101b is defective, by transmitting either the input signal 152 or the input signal 153 as the output signal 155. The down/up select signal 172 can indicate the location of the other controller 113 and, particularly, can indicate whether the other controller 113, which is enabled when the controller 113 on IC chip 101b is defective, is located on a lower IC chip in the stack or a higher IC chip in the stack. That is, when the controller condition signal 171 indicates that the controller 113 on IC chip 101b is defective, the multiplexer 160 can, as dictated by the down/up select signal 172, automatically and selectively enable a controller 113 that is either on a lower IC chip in the stack by transmitting the input signal 152 as the output signal 155 or on a higher IC chip in the stack by transmitting the input signal 153 as the output signal 155. Consequently, integration of the reconfiguration circuitry 112 of the built-in self-maintenance blocks 110 between the IC chips 101a-101n allows for servicing of the various functional blocks 120 on the IC chips 101a-101n at the stacked chip module-level and further allows for sparing around (i.e., multiplexing around, working around, etc.) defective controllers 113 so that servicing of any given functional block on any given IC chip in the stack can proceed even when a controller associated with the built-in self-maintenance block for that given functional block has been determined to be defective (e.g., during previous wafer-level servicing).

Optionally, the reconfiguration circuitry 112 on each IC chip 101a-101n can further comprise signal drivers 162. These signal drivers 162 can drive (i.e., can be adapted to drive, can be configured to drive, etc.) the input signal 152 at the TSV 131b and the input signal 153 at the wire/via 131c to the multiplexer 161. Optionally, these signal drivers 162 can be enabled by the controller condition signal 171 and, specifically, can operate only when the controller condition signal 171 indicates that the controller 113 on the same IC chip is defective.

It should be noted that, for each IC chip 101a-101n, the condition of the controller 113 as defective or functional can be predetermined (e.g., during wafer-level servicing) and the controller condition signal 171, which is indicative of this condition, can be stored (e.g., prior to packaging into the stacked chip module) in a non-volatile memory located on the same IC chip (e.g., an on-chip fuse, a flash memory, etc.). Additionally, for each IC chip 101a-101n, the down/up select signal 172 can be predetermined (e.g., by the designer) and can also be stored in a non-volatile memory (e.g., an on-chip fuse, flash memory, etc.). It should be noted that, for a bottom IC chip in the stack, this signal 172 will always be an up select signal; whereas for the top IC chip in the stack, this signal 172 will always be on a down select signal.

Figure 3:
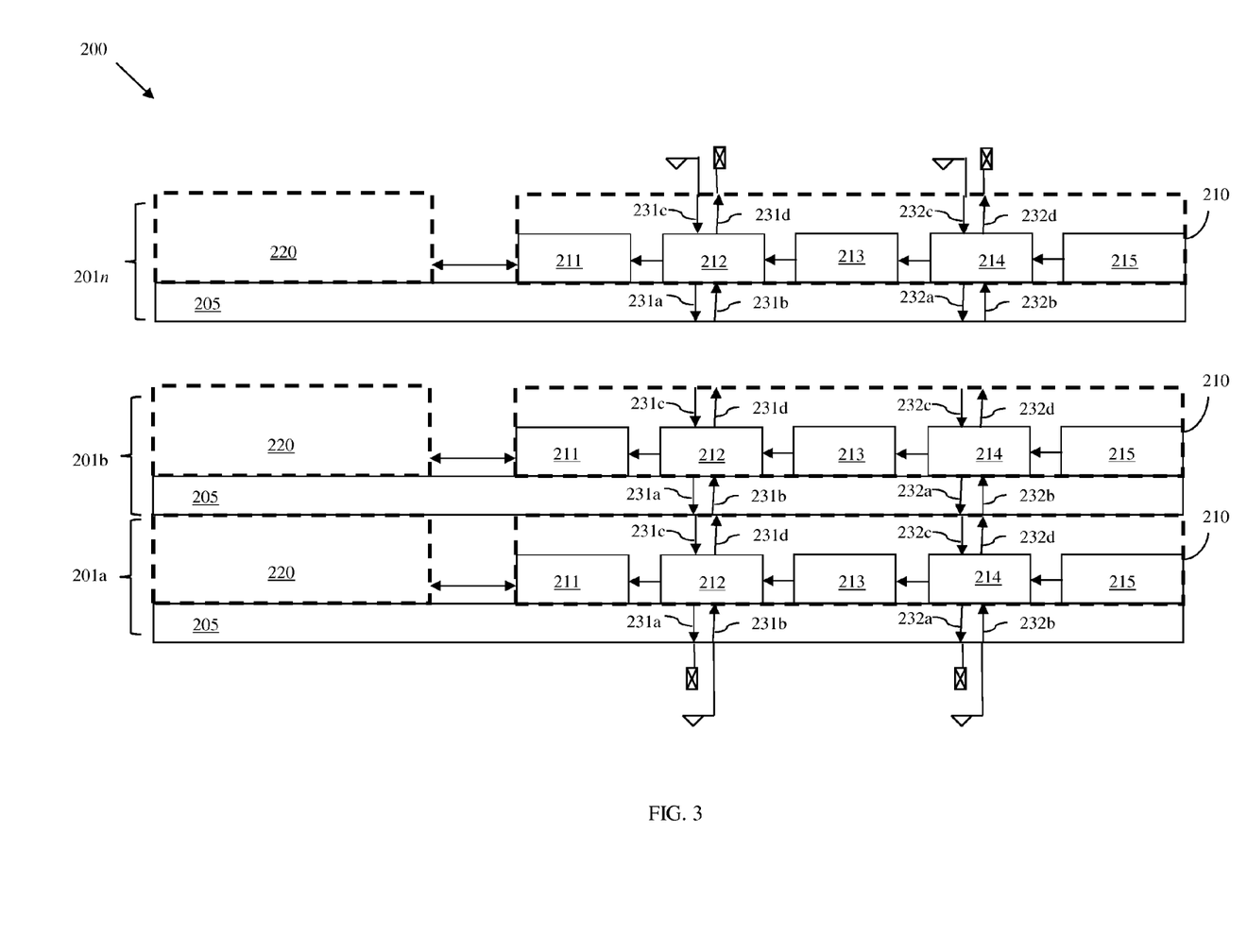
FIG. 3 is a schematic diagram illustrating another embodiment of a stacked chip module.

Referring to FIG. 3, one specific embodiment of a stacked chip module 200 disclosed herein can comprise a stack of integrated circuit (IC) chips 201a-201n. For purposes of illustration, the stacked chip module 200 is shown as having three stacked IC chips. However, it should be understood that the stacked chip module 200 can, alternatively, comprise any number of two or more IC chips. Each of the IC chips 201a-201n in the stack can comprise a substrate 205, a functional block 220 and a built-in self-maintenance block 210 on the substrate, a plurality of first interconnect structures 231a-d and a plurality of second interconnect structures 232a-d.

The functional block 220 on each IC chip 201a-201n can comprise a memory array. For example, the functional block can comprise a dynamic random access memory (DRAM) array, a static random access memory (SRAM) array, or any other suitable memory array. Alternatively, the functional block can comprise another other type of digital or analog circuit capable of being subject to self-maintenance (i.e., self-servicing, such as self-testing or self-repairing).

The built-in self-maintenance block 210 on each IC chip 201a-201n can be, for example, a built-in self-test (BIST) block for testing the functional block 220 or a built-in self-repair (BISR) block for repairing the functional block 220. Thus, this built-in self-maintenance block 210 can comprise built-in self-maintenance circuitry 211 (e.g., built-in self-testing circuitry or built-in self-repairing circuitry, as applicable) for servicing (e.g., self-testing or self-repairing) the functional block 220 at both the wafer-level and the stacked chip module-level.

This built-in self-maintenance block 210 can further comprise at least two controllers 213, 215 (e.g., embedded processors) and associated reconfiguration circuitry 212, 214. Specifically, this built-in self-maintenance block 210 can comprise a first controller 213 for controlling servicing of the functional block 220 by the built-in self-maintenance circuitry 211 at least during wafer-level servicing and first reconfiguration circuitry 212 in communication with the first controller 213 and the built-in self-maintenance circuitry 211. That is, the first reconfiguration circuitry 212 provides a communication link between the first controller 213 and the built-in self-maintenance circuitry 211. This built-in self-maintenance block 210 can also comprise a second controller 215 for providing signal buffering to the first controller 213 at least during wafer-level servicing and second reconfiguration circuitry 214 in communication with the first controller 213 and the second controller 215. That is, the second reconfiguration circuitry 214 provides a communication link between the second controller 215 and the first controller 213.

The plurality of first interconnect structures 231a-d can be electrically connected to the first reconfiguration circuitry 212 and can further electrically connect the first reconfiguration circuitry 212 to any adjacent first reconfiguration circuitry 212 of any adjacent IC chips in the stack. Similarly, the plurality of second interconnect structures 232a-d can be electrically connected to the second reconfiguration circuitry 214 and can further electrically connect the second reconfiguration circuitry 212 to any adjacent second reconfiguration circuitry 214 of any adjacent IC chips in the stack. Specifically, the first interconnect structures 231a-d and the second interconnect structures 232a-d can both comprise, for example, a combination of through substrate vias (TSVs) 231a-b, 232a-b allowing electrical connections between the reconfiguration circuitry 212, 214 and any adjacent reconfiguration circuitry 212, 214, respectively, on any IC chip immediately below and wires and/or vias 231c-d, 232c-d within the IC chip wiring levels allowing electrical connections between the reconfiguration circuitry 212, 214 and any adjacent reconfiguration circuitry 212, 214, respectively, on any IC chip immediately above. In this case, wires/vias 231c-d and wires/vias 232c-d on the bottom IC chip 201a in the stack can be electrically and physically connected to the TSVs 231a-b and 232a-b, respectively, of the next higher IC chip 201b in the stack and, thereby to the reconfiguration circuitry 212, 214 of the built-in self-maintenance block 210 on the next higher IC chip 201b. Similarly, wires/vias 231c-d and 232c-d on IC chip 201b can be electrically and physically connected to the TSVs 231a-b and 232a-b, respectively, of the next higher IC chip 201n in the stack and, thereby to the reconfiguration circuitry 212, 214 of the built-in self-maintenance block 210 on that IC chip 201n. As a result, the interconnect structures 231a-d, 232a-d integrate the built-in self-maintenance blocks 210 and, particularly, the first and second reconfiguration circuitry 212, 214 of those built-in self-maintenance blocks 210 across all of the IC chips 201a-201n in the stack.

Figure 4A:
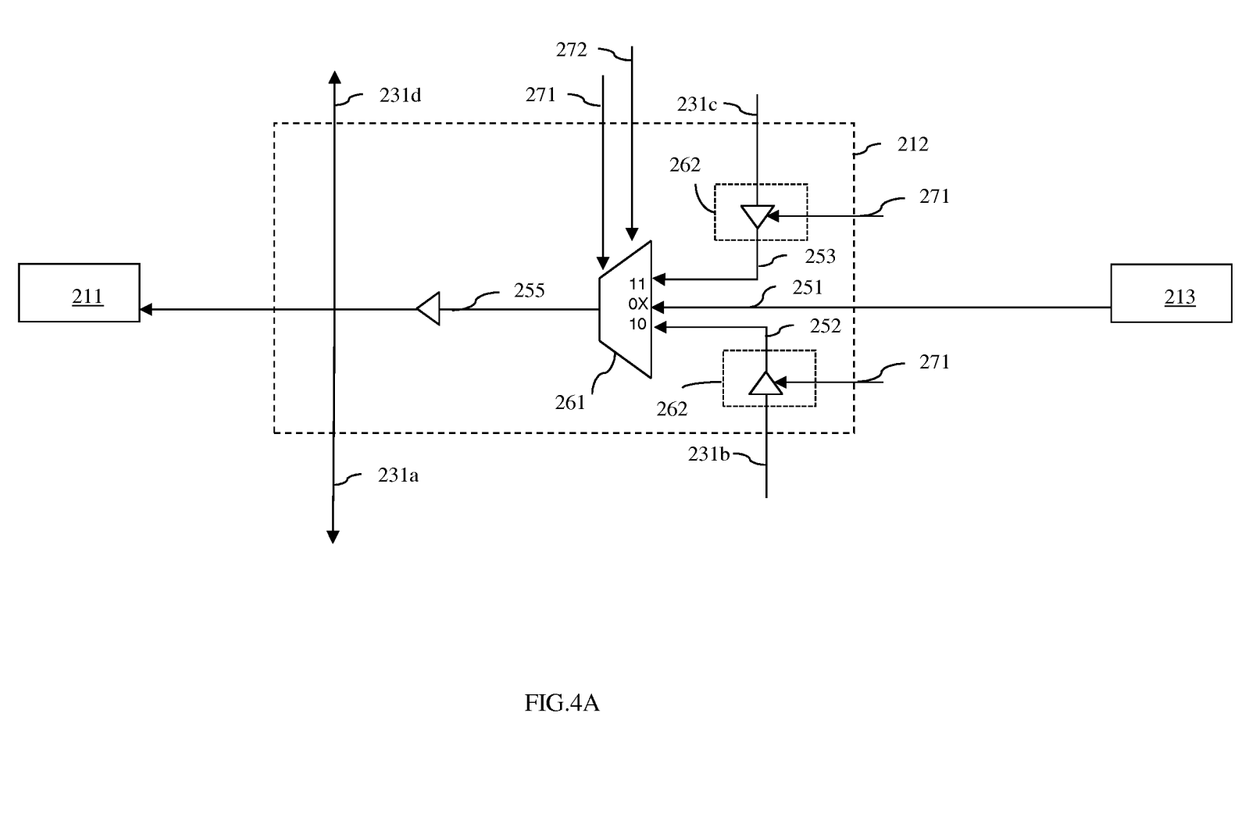
FIG. 4A is a schematic diagram illustrating exemplary first reconfiguration circuitry that can be incorporated into the stacked chip module of FIG. 3.

Referring to FIG. 4a, the first reconfiguration circuitry 212 can comprise, for example, a first multiplexer 261 or any other suitable multi-signal switching mechanism. This first multiplexer 261 can receive three first multiplexer input signals 251-253: (1) an input signal 251 from the first controller 213 on the same IC chip; (2) an input signal 252 from first reconfiguration circuitry 212 on an IC chip immediately below, if any (e.g., through first TSV 231b) and (3) an input signal 253 from first reconfiguration circuitry 212 on an IC chip immediately above, if any (e.g., through first wire/via 231c). The first multiplexer 261 can further receive first control signals 271-272 that determine which of the three input signals 251, 252 and 253 to automatically and selectively output as an output signal 255 for controlling servicing of the functional block 220 by the built-in self-maintenance circuitry 211 during stacked chip module-level servicing. As illustrated, this output signal 255 can further be transmitted down to any first reconfiguration circuitry 212 immediately below (e.g., through first TSV 231a) and up to any first reconfiguration circuitry 212 immediately above (e.g., through first wire/via 231d). As a result, the first multiplexer 261 can automatically and selectively enable either the first controller 213 on the same chip or another first controller 213 on another IC chip (e.g., above or below) in the stack to control servicing of the functional block 220 by the built-in self-maintenance circuitry 211 during stacked chip module-level servicing by transmitting the appropriate input signal 251, 252 or 253.

For purposes of illustration, operation of the first multiplexer 261 on any given IC chip during stacked chip module-level servicing is described in detail below with respect to IC chip 201b. During stacked chip module-level servicing, the first multiplexer 261 can receive and be controlled by (i.e., can be adapted to receive and be controlled by, can be configured to receive and be controlled by) a first controller condition signal 271 and a first down/up select signal 272. The first controller condition signal 271 can indicate the condition of the first controller 213 on IC chip 201b, as either functional or defective. The first multiplexer 261 can automatically and selectively enable the first controller 213 on IC chip 201b to control servicing of the functional block 220 by the built-in self-maintenance circuitry 211 on IC chip 201b, when the first controller condition signal 271 indicates that the first controller 213 on IC chip 201b is functional, by transmitting the input signal 251 as the output signal 255. Alternatively, the first multiplexer 261 can automatically and selectively enable another first controller 213 from another IC chip in the stack to control servicing of the functional block 120 by the built-in self-maintenance circuitry 211 on IC chip 201b, when the first controller condition signal 271 indicates that the first controller 213 on IC chip 201b is defective, by transmitting either the input signal 252 or the input signal 253 as the output signal 255. The first down/up select signal 272 can indicate the first location of the other first controller 213 and, particularly, can indicate whether the other first controller 213, which is enabled when the first controller 213 on IC chip 201b is defective, is located on a lower IC chip in the stack or a higher IC chip in the stack. That is, when the first controller condition signal 271 indicates that the first controller 213 on IC chip 101b is defective, the first multiplexer 261, as dictated by the first down/up select signal 272, can automatically and selectively enable either the first controller 213 on a lower IC chip in the stack by transmitting the input signal 252 as the output signal 255 or the first controller 213 on a higher IC chip in the stack by transmitting the input signal 253 as the output signal 255.

Figure 4B:
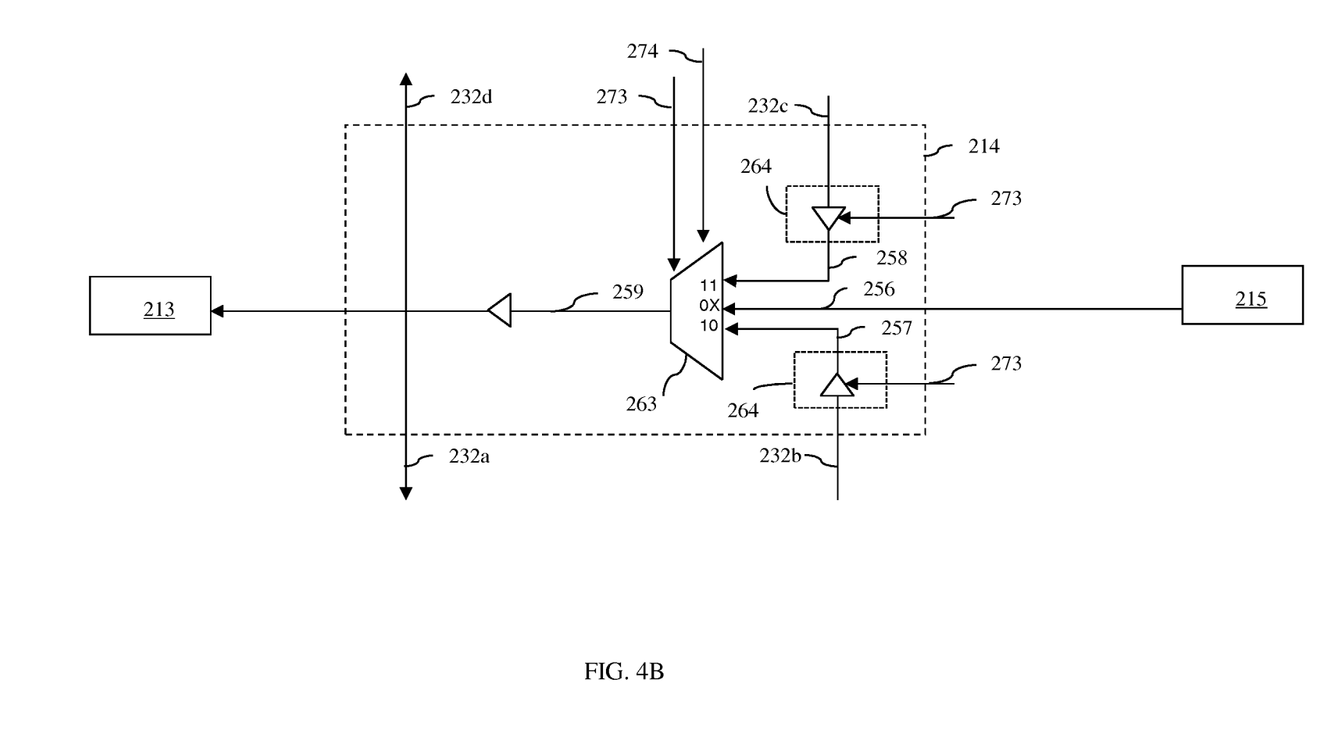
FIG. 4B is a schematic diagram illustrating exemplary second reconfiguration circuitry that can be incorporated into the stacked chip module of FIG. 3.

Referring to FIG. 4b, the second reconfiguration circuitry 214 can be configured in essentially the same way as the first reconfiguration circuitry 212. That is, the second reconfiguration circuitry 214 can comprise, for example, a second multiplexer 263 or any other suitable multi-signal switching mechanism. This second multiplexer 263 can receive three second multiplexer input signals: (1) an input signal 256 from the second controller 215 on the same IC chip; (2) an input signal 257 from second reconfiguration circuitry 214 on an IC chip immediately below, if any (e.g., through second TSV 232b) and (3) an input signal 258 from second reconfiguration circuitry 214 on an IC chip immediately above, if any (e.g., through second wire/via 232c). The second multiplexer 263 can further receive two control signals 273 and 274 that determine which of the three input signals 256, 257 and 258 to automatically and selectively output as an output signal 259 for providing signal buffering to the first controller 213 during stacked chip module-level servicing. As illustrated, this output signal 259 can further be transmitted down to any second reconfiguration circuitry 214 immediately below (e.g., through second TSV 232a) and up to any second reconfiguration circuitry 214 immediately above (e.g., through second wire/via 232d). As a result, the second multiplexer 263 can automatically and selectively enable either the second controller 215 on the same chip or another second controller 215 on another IC chip (e.g., above or below) in the stack to provide signal buffering to the first controller 213 during stacked chip module-level servicing by transmitting the appropriate input signal 256, 257 or 258.

For purposes of illustration, operation of the second multiplexer 263, like operation of the multiplexer 261, on any given IC chip during stacked chip module-level servicing is described in detail below with respect IC chip 201b. During stacked chip module-level servicing, the second multiplexer 263 can receive and be controlled by (i.e., can be adapted to receive and be controlled by, can be configured to receive and be controlled by) a second controller condition signal 273 and a second down/up select signal 274. The second controller condition signal 273 can indicate the condition of the second controller 215 on IC chip 201b, as either functional or defective. The second multiplexer 263 can automatically and selectively enable the second controller 215 on IC chip 201b to provide signal buffering to the first controller 213 on IC chip 201b, when the second controller condition signal 273 indicates that the second controller 215 on IC chip 201b is functional, by transmitting the input signal 256 as the output signal 259. Alternatively, the second multiplexer 263 can automatically and selectively enable another second controller 215 from another IC chip in the stack to provide signal buffering to the first controller 213 on IC chip 201b, when the second controller condition signal 273 indicates that the second controller 215 on IC chip 201b is defective, by transmitting either the input signal 257 or the input signal 258 as the output signal 259. The second down/up select signal 274 can indicate the second location of the other second controller 215 and, particularly, can indicate whether the other second controller 215, which is enabled when the second controller 215 on IC chip 201b is defective, is located on a lower IC chip in the stack or a higher IC chip in the stack. That is, when the second controller condition signal 273 indicates that the second controller 215 on IC chip 201b is defective, the second multiplexer 263 can, as dictated by the second down/up select signal 274, automatically and selectively enable either the second controller 215 on a lower IC chip in the stack by transmitting the input signal 257 as the output signal 259 or the second controller 215 on a higher IC chip in the stack by transmitting the input signal 258 as the output signal 259.

Consequently, integration of the first reconfiguration circuitry 212 and the second reconfiguration circuitry 214 of the built-in self-maintenance blocks 210 between the IC chips 201a-201n allows for servicing of the various functional blocks 220 on the IC chips 201a-201n at the stacked chip module-level and further allows for sparing around (i.e., multiplexing around, working around, etc.) any defective first controllers 213 and/or second controllers 215 so that servicing of any given functional block on any given IC chip 201a-201n in the stack can proceed even when one or both of the controllers 213, 215 associated with the built-in self-maintenance block for that given functional block has been determined to be defective (e.g., during previous wafer-level servicing).

Optionally, the first reconfiguration circuitry 212 on each IC chip 201a-201n can further comprise signal drivers 262 and the second reconfiguration circuitry 214 on each IC chip 201a-201n can further comprise signal drivers 264. These signal drivers 262, 264 can drive (i.e., can be adapted to drive, can be configured to drive, etc.) both the second input signals 252, 257 at the TSVs 231b, 232b and the third input signals 253, 258 at the wires/vias 231c, 232c to the multiplexers 261, 263, respectively. Optionally, these signal drivers 262, 264 can be enabled by the respective controller condition signals 271, 273. Specifically, the signal driver 262 can operate only when the first controller condition signal 271 indicates that the first controller 213 on that same IC chip is defective and the signal driver 264 can operate only when the second controller condition signal 273 indicates that the second controller 215 on that same IC chip is defective.

It should be noted that, for each IC chip 201a-201n, the condition of each of the controllers 213, 215 as defective or functional can be predetermined (e.g., during wafer-level servicing) and the respective controller condition signals 271, 273, which are indicative of the condition of these controllers 213, 215, respectively, can be stored (e.g., prior to packaging into the stacked chip module) in non-volatile memory (e.g., in on-chip fuses, flash memory, etc.) located on the same IC chip. Additionally, the down/up select signals 272, 274 can be predetermined and can similarly be stored in non-volatile memory (e.g., on-chip fuses, flash memory, etc.). It should be noted that, for a bottom IC chip in the stack, these signal 272, 274 will always be an up select signal; whereas for the top IC chip in the stack, these signal 272, 274 will always be on a down select signal.

Also disclosed herein are embodiments of a method of manufacturing and servicing stacked chip modules, such as those the stacked chip module 100 of FIG. 1 and the stacked chip module 200 of FIG. 3, described in detail above.

Figure 5:
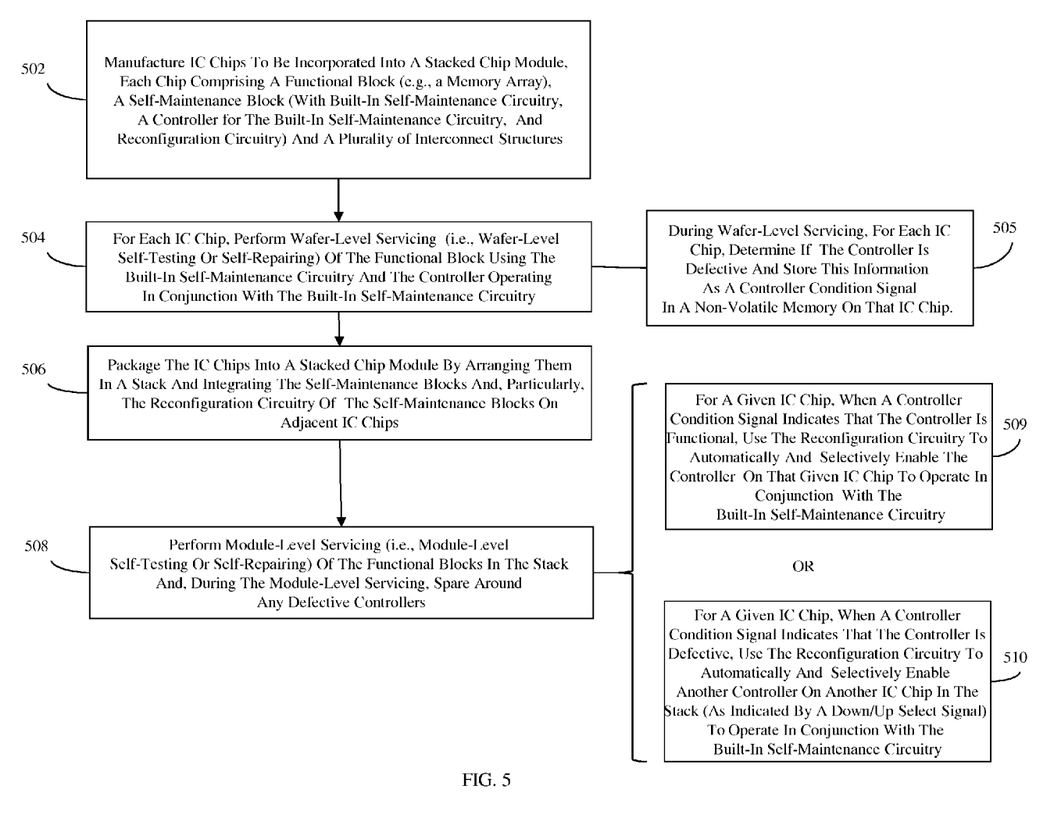
FIG. 5 is a flow diagram illustrating an embodiment of a method of manufacturing and servicing a stacked chip module, such as the stacked chip module of FIG. 1.

Specifically, referring to FIG. 5, disclosed herein are also embodiments of a method of manufacturing and servicing a stacked chip module, such as the stacked chip module 100 of FIG. 1. This method embodiment can comprise manufacturing integrated circuit (IC) chips 101a-101n to be incorporated into a stacked chip module 100 (502). Specifically, each IC chip 101a-101n can be manufactured, as described in greater detail above with regard to FIG. 1, so as to comprise a functional block 120 (e.g., a memory array or other functional block), a built-in self-maintenance block 110 (e.g., a built-in self-test (BIST) block or a built-in self-repair (BISR) block), and a plurality of interconnect structures 131a-d (e.g., a combination of through substrate vias (TSVs) 131a-b and wiring level wires and/or vias (wires/vias) 131c-d). The built-in self-maintenance block 110 can comprise built-in self-maintenance circuitry 111 for servicing (e.g., self-testing or self-repairing, as applicable) of the functional block 120, a controller 113 for the built-in self-maintenance circuitry, and reconfiguration circuitry 112, as shown in greater detail in FIG. 2, in communication with the controller 113 and electrically connected to the plurality of interconnect structures 131a-d.

Once the IC chips 101a-101n are manufactured, wafer-level servicing of the functional block 120 of each IC chip 101a-101n can be performed using the built-in self-maintenance circuitry 111 and the controller 113 operating in conjunction with the built-in self-maintenance circuitry 111 (504). During wafer-level servicing, for each IC chip (e.g., for IC chip 101b for purposes of illustration) a determination can be made as to the condition (e.g., functional or defective) of the controller 113 on that IC chip 101b and this information can be stored, as a controller condition signal 171, in a non-volatile memory (e.g., in an on-chip fuse, flash memory, etc.) on the IC chip 101b.

After wafer-level servicing is performed, the IC chips 101a-101n can be packaged into the stacked chip module 100 (506). Specifically, the IC chips 101a-101n can be arranged in a stack and, on each IC chip 101a-101n in the stack, the plurality of interconnect structures 131a-d can be used to integrate (i.e., electrically connect) the reconfiguration circuitry 112 of the built-in self-maintenance block 110 to any adjacent reconfiguration circuitry 112 of any adjacent built-in self-maintenance blocks 110 on any adjacent IC chips in the stack. For example, the wires/vias 131c-d on the bottom IC chip 101a in the stack can be electrically and physically connected to the TSVs 131a-b, respectively, of the next higher IC chip 101b in the stack and, thereby to the reconfiguration circuitry 112 of the built-in self-maintenance block 110 on the IC chip 101b. Similarly, the wires/vias 131c-d on the IC chip 101b can be electrically and physically connected to the TSVs 131a-b, respectively, of the next higher IC chip 101n in the stack and, thereby to the reconfiguration circuitry 112 of the built-in self-maintenance block 110 on that IC chip 101n. As a result, these interconnect structures 131a-d will integrate the built-in self-maintenance blocks 110 and, particularly, the reconfiguration circuitry 112 of those built-in self-maintenance blocks 110 across all of the IC chips 101a-101n in the stack.

Next, stacked chip module-level servicing of the functional blocks 120 on all of the IC chips 101a-101n in the stack can be performed and, during this stacked chip module-level servicing, the reconfiguration circuitry 112 on each IC chip 101a-101n in the stack can be used to spare around (i.e., multiplex around, work around, etc.) any defective controllers (508). Specifically, the stacked chip module-level servicing at process 508 can comprise receiving, by the reconfiguration circuitry 112 of any given IC chip (e.g., IC chip 101b for purposes of illustration), the controller condition signal 171 and an down/up select signal 172 associated with the controller 113 on that IC chip 101b (see FIG. 2). Based on these signals 171-172, either the controller 113 on that given IC chip 101b or another controller 113 on another IC chip in the stack can be automatically and selectively enabled, by the reconfiguration circuitry 112, to operate in conjunction with the built-in self-maintenance circuitry 111 during stacked chip module-level servicing.

More specifically, the controller 113 on the given IC chip 101b can be automatically and selectively enabled by the reconfiguration circuitry 112 on that IC chip 101b to operate in conjunction with the built-in self-maintenance circuitry during stacked-chip module-level servicing if the associated controller condition signal 171 indicates that the controller 113 on the IC chip 101b was previously determined during wafer-level servicing at process 505 to be functional (509). However, another controller 113 on another one of the IC chips in the stack and, particularly, another controller 113 located on either a lower IC chip 101a in the stack or a higher IC chip 101n in the stack chip, as dictated by the down/up select signal 172, can be automatically and selectively enabled by the reconfiguration circuitry 112 on IC chip 101b to operate in conjunction with the built-in self-maintenance circuitry during stacked-chip module-level servicing if the associated controller condition signal 171 indicates that the controller 113 on IC chip 101b was previously determined during wafer-level servicing at process 505 to be defective (510). It should be noted that preferred location of the other controller used at process 510 (i.e., on a lower IC chip in the stack or a higher IC chip in the stack) can be predetermined (e.g., following wafer-level servicing at process 505) and this information and, particularly, the down/up select signal 172, which indicates the location, can be stored in a non-volatile memory (e.g., in an on-chip fuse, flash memory, etc.) on the IC chip.

Figure 6:
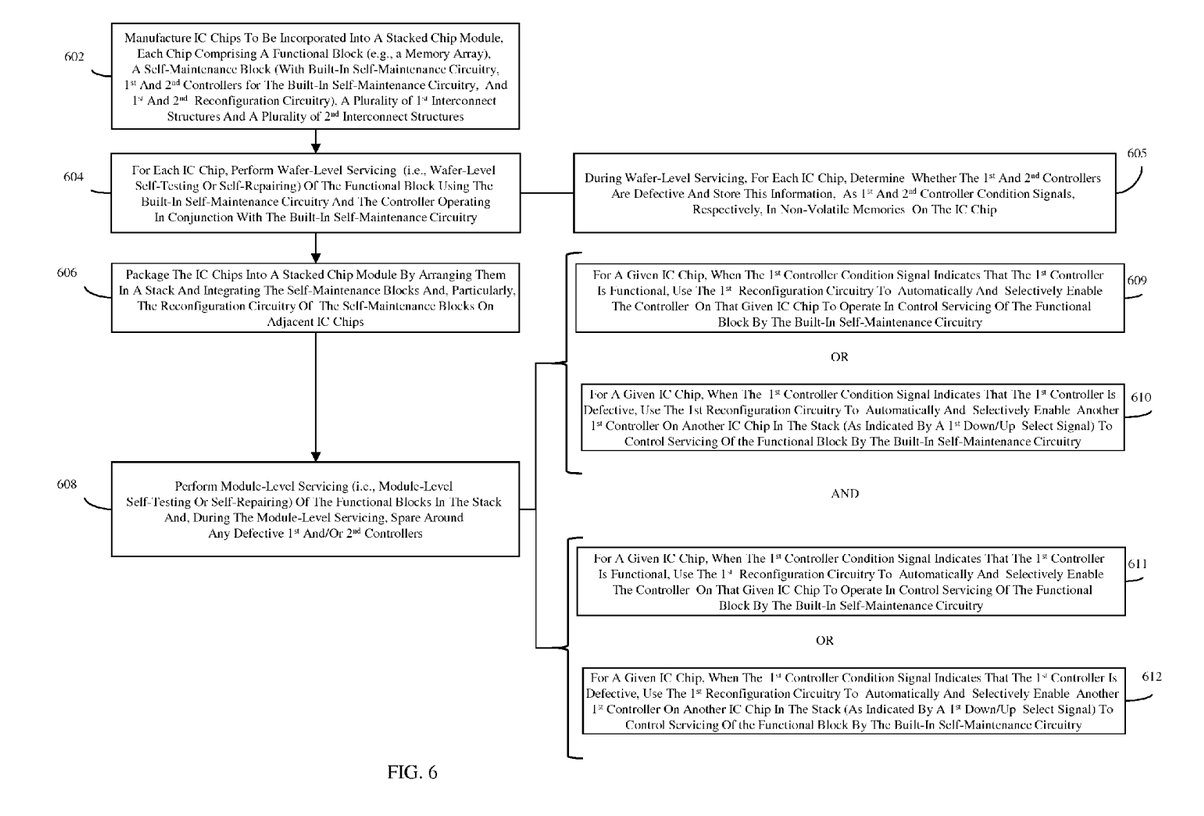
FIG. 6 is a flow diagram illustrating an embodiment of a method of manufacturing and servicing a stacked chip module, such as the stacked chip module of FIG. 3.

Referring to FIG. 6, in another embodiment method of manufacturing and servicing a stacked chip module, such as the stacked chip module 200 of FIG. 3. This method embodiment can comprise manufacturing integrated circuit (IC) chips 201a-201n to be incorporated into a stacked chip module 200 (602).

In this case, each IC chip 201a-201n can be manufactured such that it comprises a functional block 220 (e.g., a memory array or other functional block), a built-in self-maintenance block 210 (e.g., a built-in self-test (BIST) block or a built-in self-repair (BISR) block), a plurality of first interconnect structures 231a-d (e.g., a combination of first through substrate vias (TSVs) 231a-b and first wires and/or vias on the wiring levels (wires/vias) 231c-d) and a plurality of second interconnect structures 232a-d (e.g., a combination of second through substrate vias (TSVs) 232a-b and second wires and/or vias on the wiring levels (wires/vias) 232c-d). The built-in self-maintenance block 210 on each IC chip 201a-201n can be, for example, a built-in self-test (BIST) block for testing the functional block 220 or a built-in self-repair (BISR) block for repairing the functional block 220. Thus, this built-in self-maintenance block 210 can comprise built-in self-maintenance circuitry 211 (e.g., built-in self-testing circuitry or built-in self-repairing circuitry, as applicable) for servicing (e.g., self-testing or self-repairing) the functional block 220 at both the wafer-level and the stacked chip module-level. This built-in self-maintenance block 210 can further comprise at least two controllers 213, 215 (e.g., embedded processors) and associated reconfiguration circuitry 212, 214. Specifically, this built-in self-maintenance block 210 can comprise a first controller 213 for controlling servicing of the functional block 220 by the built-in self-maintenance circuitry 211 at least during wafer-level servicing and first reconfiguration circuitry 212, as shown in greater detail in FIG. 4a, in communication with the first controller 213 and the built-in self-maintenance circuitry 211 and electrically connected to the first interconnect structures 231a-d. This built-in self-maintenance block 210 can also comprise a second controller 215 for providing signal buffering to the first controller 213 at least during wafer-level servicing and second reconfiguration circuitry 214, as shown in greater detail in FIG. 4b, in communication with the first controller 213 and the second controller 215 and electrically connected to second interconnect structures 232a-d.

Once the IC chips 201a-201n are manufactured, wafer-level servicing of the functional block 220 of each IC chip 201a-201n can be performed using the first controller 213 to control servicing of the functional block 220 by the built-in self-maintenance circuitry 211 and using the second controller 215 to provide signal buffering to the first controller 213 (604). During wafer-level servicing, for each IC chip (e.g., for IC chip 201b for purposes of illustration), a determination can be made as to the condition (e.g., functional or defective) of both the first controller 213 and second controller 215 on IC chip 201b and this information can be stored, as a first controller condition signal 271 and a second controller condition signal 273, respectively, in non-volatile memory (e.g., in on-chip fuses, flash memory, etc.) on IC chip 101b (605).

After wafer-level servicing is performed, the IC chips 201a-201n can be packaged into the stacked chip module 200 (606). Specifically, the IC chips 201a-201n can be arranged in a stack and, on each IC chip 201a-201n, the first and second interconnect structures 231a-d, 232a-d can be used to integrate the first and second reconfiguration circuitry 212, 214 with the first and second reconfiguration circuitry 212, 214, respectively, on any adjacent IC chips in the stack. For example, wires/vias 231c-d, wires/vias 232c-d on the bottom IC chip 201a in the stack can be electrically and physically connected to the TSVs 231a-b, 232a-b of the next higher IC chip 201b in the stack and, thereby to the reconfiguration circuitry 212, 214, respectively, of the built-in self-maintenance block 210 on the IC chip 201b. Similarly, wires/vias 231c-d, 232c-d on IC chip 201b can be electrically and physically connected to the TSVs 231a-b, 232a-b of the next higher IC chip 201n in the stack and, thereby to the reconfiguration circuitry 212, 214, respectively, of the built-in self-maintenance block 210 on that IC chip 201n. As a result, the interconnect structures 231a-d, 232a-d integrate the built-in self-maintenance blocks 210 and, particularly, the first and second reconfiguration circuitry 212, 214 of those built-in self-maintenance blocks 210 across all of the IC chips 201a-201n in the stack.

Next, stacked chip module-level servicing of the functional blocks 220 on the IC chips 201a-201n in the stack can be performed and, during this stacked chip module-level servicing, the first reconfiguration circuitry 212 and the second reconfiguration circuitry 214 on each IC chip 201a-201n in the stack can be used to spare around (i.e., multiplex around, work around, etc.) around any defective first controllers 213 and/or second controllers 215 (608). Specifically, the stacked chip module-level servicing at process 608 can comprise receiving, by the first reconfiguration circuitry 212 of any given IC chip (e.g., IC chip 201b for purposes of illustration), the first controller condition signal 271 and a first down/up select signal 272 associated with the controller 213 on that IC chip 201b (see FIG. 4a). Based on these signals 271-272, either the first controller 213 on that given IC chip 201b or another first controller 213 on another IC chip in the stack can be automatically and selectively enabled, by the first reconfiguration circuitry 212, to control servicing of the functional block 220 by the built-in self-maintenance circuitry 211 during stacked chip module-level servicing.

More specifically, the first controller 213 on the given IC chip 201b can be automatically and selectively enabled by the first reconfiguration circuitry 212 on that IC chip 201b to control servicing of the functional block 220 by the built-in self-maintenance circuitry 211 during stacked-chip module-level servicing if the associated first controller condition signal 271 indicates that the first controller 213 on the IC chip 201b was previously determined during wafer-level servicing at process 505 to be functional (609). However, another first controller 213 on another one of the IC chips in the stack and, particularly, another first controller 213 located on either a lower IC chip 201a in the stack or a higher IC chip 201n in the stack chip, as dictated by the first down/up select signal 272, can be automatically and selectively enabled by the first reconfiguration circuitry 212 on IC chip 201b to control servicing of the functional block 220 by the built-in self-maintenance circuitry 211 during stacked-chip module-level servicing if the associated second controller condition signal 271 indicates that the first controller 213 on IC chip 201b was previously determined during wafer-level servicing at process 605 to be defective (610). It should be noted that preferred location of the other first controller used at process 610 (i.e., on a lower IC chip in the stack or a higher IC chip in the stack) can be predetermined (e.g., following wafer-level servicing at process 605) and this information and, particularly, the first down/up select signal 272, which indicates the location, can be stored in a non-volatile memory (e.g., in an on-chip fuse, flash memory, etc.) on the IC chip.

Similarly, the second controller 215 on the given IC chip 201b can be automatically and selectively enabled by the second reconfiguration circuitry 214 on that IC chip 201b to provide signal buffering to the first controller 213 during stacked-chip module-level servicing if the associated second controller condition signal 273 indicates that the second controller 215 on the IC chip 201b was previously determined during wafer-level servicing at process 605 to be functional (611). However, another second controller 215 on another one of the IC chips in the stack and, particularly, another second controller 215 located on either a lower IC chip 201a in the stack or a higher IC chip 201n in the stack chip, as dictated by the second down/up select signal 274, can be automatically and selectively enabled by the second reconfiguration circuitry 214 on IC chip 201b to provide signal buffering to the first controller 213 during stacked-chip module-level servicing if the associated second controller condition signal 273 indicates that the first controller 213 on IC chip 201b was previously determined during wafer-level servicing at process 605 to be defective (612). It should be noted that preferred location of the other controller used at process 612 can be predetermined (e.g., following wafer-level servicing at process 605) and this information and, particularly, the first down/up select signal 274, which indicates the location, can, like the first controller condition signal 273, be stored in a non-volatile memory (e.g., in an on-chip fuse, flash memory, etc.) on the IC chip.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a stacked chip module incorporating a plurality of integrated circuit (IC) chips having integratable and automatically reconfigurable built-in self-maintenance blocks (i.e., built-in self-test (BIST) blocks or built-in self-repair (BISR) blocks). Integration of the built-in self-maintenance blocks between the IC chips in the stack allows for servicing (e.g., self-testing or self-repairing) of functional blocks (e.g., memory arrays) at the stacked chip module-level. Automatic reconfiguration of the built-in self-maintenance blocks further allows for functional blocks on any of the IC chips in the stack to be serviced at the stack chip module-level even when one or more controllers associated with a given built-in self-maintenance block on a given IC chip have been determined to be defective (e.g., during previous wafer-level servicing). Also disclosed herein are embodiments of a method of manufacturing and servicing such a stacked chip module.

What is claimed is:

1. A stacked chip module comprising a stack of integrated circuit chips, each of said integrated circuit chips in said stack comprising:
   a functional block;
   a self-maintenance block comprising:
      built-in self-maintenance circuitry servicing said functional block, said servicing comprising wafer-level servicing and module-level servicing;
      a controller electrically connected to said built-in self-maintenance circuitry;
      reconfiguration circuitry in communication with said controller; and
   a plurality of interconnect structures electrically connecting said reconfiguration circuitry to adjacent reconfiguration circuitry of at least one adjacent integrated circuit chip in said stack so as to allow said reconfiguration circuitry to automatically and selectively enable one of said controller and another controller on another one of said integrated circuit chips in said stack to control said built-in self-maintenance circuitry during said module-level servicing.

2. The stacked chip module of claim 1, said functional block comprising a memory array.

3. The stacked chip module of claim 1, said wafer-level servicing and said module-level comprising any one of self-testing and self-repairing.

4. The stacked chip module of claim 1, said one of said controller and said another controller being selectively enabled so as to control said servicing of said functional block by said built-in self-maintenance circuitry during said module-level servicing.

5. The stacked chip module of claim 1, said one of said controller and said another controller being selectively enabled so as to provide signal buffering during said module-level servicing.

6. The stacked chip module of claim 1, said reconfiguration circuitry comprising a multiplexer and said multiplexer performing the following during said module-level servicing:
   receiving a controller condition signal indicating a condition of said controller, said condition being either functional or defective;
   automatically and selectively enabling said controller to control said built-in self-maintenance circuitry, when said controller condition signal indicates that said controller is functional; and
   automatically and selectively enabling said another controller to control said built-in self-maintenance circuitry, when said controller condition signal indicates that said controller is defective.

7. The stacked chip module of claim 6, said multiplexer further performing the following during said module-level servicing:
   receiving a down/up select signal indicating a location of said another controller, said location being on one of a higher integrated circuit chip in said stack and a lower integrated circuit chip in said stack; and
   when said controller condition signal indicates that said controller is defective, automatically and selectively enabling said another controller at said location to control said built-in self-maintenance circuitry.

8. A stacked chip module comprising a stack of integrated circuit chips, each of said integrated circuit chips in said stack comprising:
   a functional block;
   a self-maintenance block comprising:
      built-in self-maintenance circuitry servicing said functional block, said servicing comprising wafer-level servicing and module-level servicing;
      a first controller and a second controller each electrically connected to said built-in self-maintenance circuitry;
      first reconfiguration circuitry in communication with said first controller and said built-in self-maintenance circuitry; and
      second reconfiguration circuitry in communication with said first controller and said second controller;
   a plurality of first interconnect structures electrically connecting said first reconfiguration circuitry to adjacent first reconfiguration circuitry of at least one adjacent integrated circuit chip in said stack so as to allow said first reconfiguration circuitry to automatically and selectively enable one of said first controller and another first controller on another one of said integrated circuit chips in said stack to control said servicing of said functional block by said built-in self-maintenance circuitry during said module-level servicing; and
   a plurality of second interconnect structures electrically connecting said second reconfiguration circuitry to adjacent second reconfiguration circuitry of said at least one adjacent integrated circuit chip in said stack so as to allow said second reconfiguration circuitry to automatically and selectively enable one of said second controller and another second controller on another one of said integrated circuit chips in said stack to provide signal buffering to said first controller during said module-level servicing.

9. The stacked chip module of claim 8, said functional block comprising a memory array.

10. The stacked chip module of claim 8, said wafer-level servicing and said module-level servicing comprising any one of self-testing and self-repairing.

11. The stacked chip module of claim 8, said first reconfiguration circuitry comprising a first multiplexer and said first multiplexer performing the following during said module-level servicing:
   receiving a first controller condition signal indicating a first condition of said first controller, said first condition being either functional or defective;
   automatically and selectively enabling said first controller to control said servicing of said functional block by said built-in self-maintenance circuitry, when said first controller condition signal indicates that said first controller is functional; and
   automatically and selectively enabling said another first controller to control said servicing of said functional block by said built-in self-maintenance circuitry, when said first controller condition signal indicates that said first controller is defective.

12. The stacked chip module of claim 11, said first multiplexer further performing the following during said module-level servicing:
   receiving a first down/up select signal indicating a first location of said another first controller, said first location being on one of a higher integrated circuit chip in said stack and a lower integrated circuit chip in said stack; and,
   when said first controller condition signal indicates that said first controller is defective, automatically and selectively enabling said another first controller at said first location to control said servicing of said functional block by said built-in self-maintenance circuitry.

13. The stacked chip module of claim 11, said second reconfiguration circuitry comprising a second multiplexer and said second multiplexer performing the following during said module-level servicing:
   receiving a second controller condition signal indicating a second condition of said second controller, said second condition being either function or defective;
   automatically and selectively enabling said second controller to provide said signal buffering to said first controller, when said second controller condition signal indicates that said second controller is functional; and
   automatically and selectively enabling said another second controller to provide said signal buffering to said first controller, when said second controller condition signal indicates that said second controller is defective.

14. The stacked chip module of claim 13, said second multiplexer further performing the following during said module-level servicing:
   receiving a second down/up select signal indicating a second location of said another second controller, said second location being on one of a higher integrated circuit chip in said stack and a lower integrated circuit chip in said stack; and,
   when said second controller condition signal indicates that said second controller is defective, automatically and selectively enabling said another second controller at said second location to provide said signal buffering to said first controller.

15. A stacked chip module manufacturing and servicing method comprising:
   manufacturing integrated circuit chips to be incorporated into a stacked chip module, each of said integrated circuit chips in said stack comprising:
      a functional block;
      a self-maintenance block comprising:
         built-in self-maintenance circuitry servicing said functional block, said servicing comprising wafer-level servicing and module-level servicing;
         a controller electrically connected to said built-in self-maintenance circuitry;
         reconfiguration circuitry in communication with said controller; and
         a plurality of interconnect structures electrically connected to said reconfiguration circuitry;
   performing wafer-level servicing of said functional block on each of said integrated circuit chips using said built-in self-maintenance circuitry and said controller electrically connected to said built-in self-maintenance circuitry;
   packaging said integrated circuit chips into a stacked chip module by arranging said integrated circuit chips in a stack and, on each integrated circuit chip in said stack, using said interconnect structures to electrically connect said reconfiguration circuitry to adjacent reconfiguration circuitry of at least one adjacent integrated circuit chip in said stack; and,
   performing module-level servicing of said functional block on each of said integrated circuit chips, said performing of said module-level servicing comprising automatically and selectively enabling, by said reconfiguration circuitry, one of said controller and another controller on another one of said integrated circuit chips in said stack to control said built-in self-maintenance circuitry.

16. The method of claim 15, said functional block comprising a memory array.

17. The method of claim 15, said performing of said wafer-level servicing and said performing of said module-level comprising performing any one of self-testing and self-repairing.

18. The method of claim 15, said performing of said module-level servicing further comprising: receiving a controller condition signal indicating a condition of said controller, said condition being one of functional and defective; and automatically and selectively enabling, by said reconfiguration circuitry, said controller to control said built-in self-maintenance circuitry, when said controller condition signal indicates that said controller is functional.

19. The method of claim 18, said performing of said module-level servicing comprising automatically and selectively enabling, by said reconfiguration circuitry, said another controller to control said built-in self-maintenance circuitry, when said controller condition signal indicates that said controller is defective, said another controller being on a predetermined one of a lower integrated circuit chip in said stack and a higher integrated circuit chip in said stack as indicated by a down/up select signal.

20. A method of manufacturing and servicing a stacked chip module, said method comprising:
   manufacturing integrated circuit chips to be incorporated into a stacked chip module, each of said integrated circuit chips comprising:
      a functional block;
      a self-maintenance block comprising:
         built-in self-maintenance circuitry servicing said functional block, said servicing comprising wafer-level servicing and module-level servicing;

a first controller and a second controller each electrically connected to said built-in self-maintenance circuitry;
first reconfiguration circuitry in communication with said first controller and said built-in self-maintenance circuitry; and
second reconfiguration circuitry in communication with said first controller and said second controller;
a plurality of first interconnect structures electrically connected to said first reconfiguration circuitry; and
a plurality of second interconnect structures electrically connected to said second reconfiguration circuitry;
performing wafer-level servicing of said functional block on each of said integrated circuit chips using said first controller to control servicing of said functional block by said built-in self-maintenance circuitry and said second controller to provide signal buffering to said first controller;
packaging said integrated circuit chips into a stacked chip module by arranging said integrated circuit chips in a stack and, on each integrated circuit chip in said stack, using said first interconnect structures to electrically connect said first reconfiguration circuitry to adjacent first reconfiguration circuitry of at least one adjacent integrated circuit chip in said stack and further using said second interconnect structures to electrically connect said second reconfiguration circuitry to any adjacent second reconfiguration circuitry of said at least one adjacent integrated circuit chip in said stack; and,
performing module-level servicing of said functional block on each of said integrated circuit chips, said performing of said module-level servicing comprising, on each of said integrated circuit chips,
automatically and selectively enabling, by said first reconfiguration circuitry, one of said first controller and another first controller on another one of said integrated circuit chips in said stack to control said servicing of said functional block by said built-in self-maintenance circuitry; and
automatically and selectively enabling, by said second reconfiguration circuitry, one of said second controller and another second controller on another one of said integrated circuit chips in said stack to provide said signal buffering.

21. The method of claim 20, said functional block comprising a memory array.

22. The method of claim 20, said performing of said wafer-level servicing and said performing of said module-level servicing comprising performing any one of self-testing and self-repairing.

23. The method of claim 20, said performing of said module-level servicing further comprising: receiving a first controller condition signal indicating a first condition of said first controller, said first condition being either functional or defective; and, automatically and selectively enabling, by said first reconfiguration circuitry, said first controller to control said servicing of said functional block by said built-in self-maintenance circuitry, when said first controller condition signal indicates that said first controller is functional.

24. The method of claim 23, said performing of said module-level servicing further comprising automatically and selectively enabling, by said first reconfiguration circuitry, said another first controller to control said servicing of said functional block by said built-in self-maintenance circuitry, when said first controller condition signal indicates that said first controller is defective, said another first controller being on a predetermined one of a lower integrated circuit chip in said stack and a higher integrated circuit chip in said stack as indicated by a first down/up select signal.

25. The method of claim 20, said performing of said module-level servicing comprising: receiving a second controller condition signal indicating a second condition of said second controller, said second condition being either functional or defective; and automatically and selectively enabling, by said second reconfiguration circuitry, said second controller to provide said signal buffering to said first controller, when said second controller condition signal indicates that said second controller is functional.

* * * * *